United States Patent
Zhang et al.

(10) Patent No.: US 10,388,203 B2
(45) Date of Patent: Aug. 20, 2019

(54) GOA UNIT CIRCUITS, METHODS FOR DRIVING THE SAME, AND GOA CIRCUITS

(71) Applicant: BOE TECHNOLOGY GROUP CO., LTD., Beijing (CN)

(72) Inventors: Yuanbo Zhang, Beijing (CN); Shuai Chen, Beijing (CN)

(73) Assignee: BOE TECHNOLOGY GROUP CO., LTD., Beijing (CN)

(*) Notice: Subject to any disclaimer, the term of this patent is extended or adjusted under 35 U.S.C. 154(b) by 0 days.

(21) Appl. No.: 15/743,617

(22) PCT Filed: May 22, 2017

(86) PCT No.: PCT/CN2017/085307
§ 371 (c)(1),
(2) Date: Jan. 10, 2018

(87) PCT Pub. No.: WO2017/206751
PCT Pub. Date: Dec. 7, 2017

(65) Prior Publication Data
US 2018/0204496 A1    Jul. 19, 2018

(30) Foreign Application Priority Data

May 30, 2016 (CN) .......................... 2016 1 0370694

(51) Int. Cl.
*G09G 3/20* (2006.01)
*G11C 19/28* (2006.01)

(52) U.S. Cl.
CPC ....... *G09G 3/20* (2013.01); *G09G 2310/0267* (2013.01); *G09G 2310/0286* (2013.01);
(Continued)

(58) Field of Classification Search
None
See application file for complete search history.

(56) References Cited

U.S. PATENT DOCUMENTS 8,208,598 B2 * 6/2012 Tsai .................... G09G 3/3677
377/64
2008/0016139 A1 * 1/2008 Tsai .................... G09G 3/3674
708/503
(Continued)

FOREIGN PATENT DOCUMENTS

CN     104299594 A    1/2015
CN     14616617 A     5/2015
(Continued)

OTHER PUBLICATIONS

International Search Report and Written Opinion dated Aug. 22, 2017, for corresponding PCT Application No. PCT/CN2017/085307.

*Primary Examiner* — Lunyi Lao
*Assistant Examiner* — Benjamin X Casarez
(74) *Attorney, Agent, or Firm* — Kinney & Lange, P.A.

(57) ABSTRACT

The present disclosure provides a GOA unit circuit, a method for driving the same, and a GOA circuit. The GOA unit circuit comprises a first input sub-circuit, a pull-up sub-circuit, a first pull-down sub-circuit, a reset sub-circuit, a second input sub-circuit, a noise control sub-circuit, a first de-noising sub-circuit, and a second de-noising sub-circuit. The first pull-down sub-circuit is connected to an output signal terminal, a first clock control signal terminal and a discharge signal terminal, a discharge signal provided by the discharge signal terminal is at a high level higher than that of an input signal provided by the input signal terminal, and the first pull-down sub-circuit is configured to discharge the output signal terminal under the control of the first clock control signal and the discharge signal, to pull down a potential at the output signal terminal to a low level. The GOA unit circuit is configured to drive gate lines of a display apparatus.

14 Claims, 9 Drawing Sheets

(52) U.S. Cl.
   CPC ... *G09G 2310/061* (2013.01); *G09G 2310/08* (2013.01); *G09G 2330/021* (2013.01); *G11C 19/28* (2013.01)

(56) References Cited

U.S. PATENT DOCUMENTS

| | | | |
|---|---|---|---|
| 2010/0150301 A1* | 6/2010 | Chan | G11C 19/28 377/64 |
| 2010/0245300 A1* | 9/2010 | Chan | G09G 3/3677 345/204 |
| 2010/0260312 A1* | 10/2010 | Tsai | G09G 3/3677 377/79 |
| 2011/0150169 A1 | 6/2011 | Lin et al. | |
| 2015/0187311 A1* | 7/2015 | Kuo | G02F 1/13306 345/215 |
| 2016/0307641 A1* | 10/2016 | Zheng | G09G 3/3677 |
| 2016/0351159 A1* | 12/2016 | Yang | G09G 3/20 |
| 2017/0025057 A1* | 1/2017 | Li | G09G 3/3266 |
| 2017/0092376 A1* | 3/2017 | Wang | G11C 19/287 |
| 2017/0364170 A1* | 12/2017 | Gu | G06F 3/041 |
| 2018/0061508 A1* | 3/2018 | Chen | G11C 19/28 |

FOREIGN PATENT DOCUMENTS

| | | | | |
|---|---|---|---|---|
| CN | 104715734 A | * | 6/2015 | ........... G09G 3/3677 |
| CN | 105590612 A | * | 5/2016 | ............... G09G 3/36 |
| CN | 105869563 A | | 8/2016 | |

\* cited by examiner

_US 10,388,203 B2_

GOA UNIT CIRCUITS, METHODS FOR DRIVING THE SAME, AND GOA CIRCUITS

CROSS-REFERENCE TO RELATED APPLICATION(S)

The present application is a U.S. National Phase Application of PCT Application No. PCT/CN2017/085307, filed on May 22, 2017, entitled "GOA UNIT CIRCUITS, METHODS FOR DRIVING THE SAME, AND GOA CIRCUITS," which claims priorities to Chinese Patent Application No. CN201610370694.7, filed on May 30, 2016, which is incorporated herein by reference in its entirety.

TECHNICAL FIELD

The present disclosure relates to the field of display technologies, and more particularly, to a Gate Driver on Array (GOA) unit circuit, a method for driving the same, and a GOA circuit.

BACKGROUND

In the existing display technologies, in order to achieve a low cost, the GOA technology is used for most of display apparatuses. The GOA technology refers to a technology of disposing a GOA circuit for driving gate lines on two sides (i.e., bezel areas) of an effective display area of an array substrate of a display apparatus. The GOA circuit comprises a plurality of GOA unit circuits, each of which is correspondingly connected to one gate line. The GOA circuit is used to realize a shift register function, that is, one output signal is provided for all the gate lines row by row in one frame, and the output signal is a pulse signal having a certain pulse width to drive various gate lines.

SUMMARY

The present disclosure provides a GOA unit circuit, a method for driving the same, and a GOA circuit.

A first aspect of the present disclosure provides a Gate Driver on Array (GOA) unit circuit, comprising: a first input sub-circuit connected to a pull-up node and an input signal terminal, and configured to pull up a potential at the pull-up node for a first time under the control of an input signal provided by the input signal terminal; a pull-up sub-circuit connected to the pull-up node, a first clock control signal terminal and an output signal terminal, and configured to pull up the potential at the pull-up node for a second time and transfer a high level of a first clock control signal provided by the first clock control signal terminal to the output signal terminal for output under the control of the first clock control signal; a first pull-down sub-circuit connected to the output signal terminal, the first clock control signal terminal and a discharge signal terminal, wherein a discharge signal provided by the discharge signal terminal is at a high level higher than that of the input signal provided by the input signal terminal, and the first pull-down sub-circuit is configured to discharge the output signal terminal under the control of the first clock control signal provided by the first clock control signal terminal and the discharge signal provided by the discharge signal terminal to pull down a potential at the output signal terminal to a low level; a reset sub-circuit connected to the pull-up node, a reset signal terminal and a low level power supply signal terminal, and configured to reset the potential at the pull-up node under the control of a reset signal provided by the reset signal terminal and a low level power supply signal provided by the low level power supply signal terminal; a second input sub-circuit connected to a pull-down node, the pull-up node and the low level power supply signal terminal, and configured to pull down a potential at the pull-down node for a first time under the control of the high potential at the pull-up node and the low level power supply signal provided by the low level power supply signal terminal; a noise control sub-circuit connected to the pull-down node and a second clock control signal terminal, and configured to pull down the potential at the pull-down node for a second time under the control of a second clock control signal provided by the second clock control signal terminal; a first de-noising sub-circuit connected to the pull-up node, the pull-down node and the low level power supply signal terminal, and configured to de-noise the pull-up node under the control of the high potential at the pull-down node and the low level power supply signal provided by the low level power supply signal terminal; and a second de-noising sub-circuit connected to the output signal terminal, the pull-down node and the low level power supply signal terminal, and configured to de-noise the output signal terminal under the control of the high potential at the pull-down node and the low level power supply signal provided by the low level power supply signal terminal.

In an embodiment, the first input sub-circuit comprises a first transistor having a control terminal and an input terminal both connected to the input signal terminal, and an output terminal connected to the pull-up node.

In an embodiment, the pull-up sub-circuit comprises: a second transistor having a control terminal connected to the pull-up node, an input terminal connected to the first clock control signal terminal, and an output terminal connected to the output signal terminal; and a capacitor having a first terminal connected to the pull-up node, and a second terminal connected to the output signal terminal.

In an embodiment, the first pull-down sub-circuit comprises a third transistor having a control terminal connected to the discharge signal terminal, an input terminal connected to the first clock control signal terminal, and an output terminal connected to the output signal terminal.

In an embodiment, the reset sub-circuit comprises a fourth transistor having a control terminal connected to the reset signal terminal, an input terminal connected to the low level power supply signal terminal, and an output terminal connected to the pull-up node.

In an embodiment, the second input sub-circuit comprises a fifth transistor having a control terminal connected to the pull-up node, an input terminal connected to the low level power supply signal terminal, and an output terminal connected to the pull-down node.

In an embodiment, the noise control sub-circuit comprises a sixth transistor having a control terminal and an input terminal both connected to the second clock control signal terminal, and an output terminal connected to the pull-down node.

In an embodiment, the first de-noising sub-circuit comprises a seventh transistor having a control terminal connected to the pull-down node, an input terminal connected to the low level power supply signal terminal, and an output terminal connected to the pull-up node.

In an embodiment, the second de-noising sub-circuit comprises an eighth transistor having a control terminal connected to the pull-down node, an input terminal connected to the low level power supply signal terminal, and an output terminal connected to the output signal terminal.

In an embodiment, the GOA unit circuit further comprises a second pull-down sub-circuit connected to the output signal terminal, the reset signal terminal and the low level power supply signal terminal, and configured to transfer the low level power supply signal to the output signal terminal for output under the control of the reset signal provided by the reset signal terminal and the low level power supply signal provided by the low level power supply signal terminal.

In an embodiment, the second pull-down sub-circuit comprises a ninth transistor having a control terminal connected to the reset signal terminal, an input terminal connected to the low level power supply signal terminal, and an output terminal connected to the output signal terminal.

A second aspect of the present disclosure provides a method for driving a GOA unit circuit, applied to the GOA unit circuit according to the first aspect of the present disclosure, the method comprising: in an input period, setting the input signal to a high level, so that the first input sub-circuit is turned on, the potential at the pull-up node is pulled up, and the pull-up sub-circuit is turned on; setting the first clock control signal to a low level, so that the output signal terminal outputs a low level; setting the reset signal to a low level, so that the reset sub-circuit is turned off; and setting the second clock control signal to a high level, so that the noise control sub-circuit is turned on, and under the control of the high potential at the pull-up node, the second input sub-circuit is turned on, the low level power supply signal is input to the pull-down node via the second input sub-circuit to pull down the potential at the pull-down node, and the first de-noising sub-circuit and the second de-noising sub-circuit are turned off; in an output period, maintaining the pull-up sub-circuit to be turned on, and setting the first clock control signal to a high level, so that the potential at the pull-up node continues to be pulled up and the output signal terminal outputs a high level; setting the input signal to a low level, so that the first input sub-circuit is turned off, and still setting the reset signal to a low level, so that the reset sub-circuit is turned off; and setting the second clock control signal to a low level, so that the noise control sub-circuit is turned off, the second input sub-circuit is maintained to be turned on, the low level power supply signal continues to be input to the pull-down node via the second input sub-circuit to continue to pull down the potential at the pull-down node, and the first de-noising sub-circuit and the second de-noising sub-circuit are turned off; in a discharge period, setting the discharge signal to a high level higher than that of the input signal, so that the first pull-down sub-circuit is turned on; setting the first clock control signal to a low level, so that the potential at the output signal terminal is pulled down to a low level; still setting the input signal to a low level, so that the first input sub-circuit is turned off, the potential at the pull-up node is decreased to some extent, and the pull-up sub-circuit is maintained to be turned on, and still setting the reset signal to a low level, so that the reset sub-circuit is turned off; and still setting the second clock control signal to a low level, so that the noise control sub-circuit is turned off, the second input sub-circuit is maintained to be turned on, the low level power supply signal continues to be input to the pull-down node via the second input sub-circuit to continue to maintain the potential at the pull-down node at a low level, and the first de-noising sub-circuit and the second de-noising sub-circuit are turned off; and in a reset period, setting the reset signal to a high level, so that the reset sub-circuit is turned on, the low level power supply signal is input to the pull-up node via the reset sub-circuit to pull down the potential at the pull-up node to a low level, the pull-up sub-circuit is turned off, and the output signal terminal still outputs a low level; still setting the input signal to a low level, so that the first input sub-circuit is turned off; and setting the second clock control signal to a high level, so that the noise control sub-circuit is turned on, and under the control of the low potential at the pull-up node, the second input sub-circuit is turned off, and the potential at the pull-down node becomes a high level, and the first de-noising sub-circuit and the second de-noising sub-circuit are turned on, so that the first de-noising sub-circuit de-noises the pull-up node, and the second de-noising sub-circuit de-noises the output signal terminal.

In an embodiment, the method for driving a GOA unit circuit further comprises: in the reset period, setting the reset signal to a high level, so that the second pull-down sub-circuit is turned on to transfer the low level power supply signal to the output signal terminal for output; and in the input period, the output period and the discharge period, setting the reset signal to a low level, so that the second pull-down sub-circuit is turned off.

A third aspect of the present disclosure provides a GOA circuit, comprising a plurality of cascaded GOA unit circuits described above, wherein a discharge signal terminal of a previous stage of GOA unit circuit is connected to a pull-up node of a certain next stage of GOA unit circuit; first clock control signal terminals and second clock control signal terminals of odd stages of GOA unit circuits are connected to a first group of clock signal input lines; and in each of various odd stages of GOA unit circuits, an output signal terminal of a previous stage of GOA unit circuit is connected to an input signal terminal of a next stage of GOA unit circuit, a reset signal terminal of the previous stage of GOA unit circuit is connected to an output signal terminal of the next stage of GOA unit circuit, and an input signal provided by an input signal terminal of a first stage of GOA unit circuit and a reset signal provided by a reset signal terminal of a last stage of GOA unit circuit are provided by a system; and first clock control signal terminals and second clock control signal terminals of even stages of GOA unit circuits are connected to a second group of clock signal input lines; and in each of various even stages of GOA unit circuits, an output signal terminal of a previous stage of GOA unit circuit is connected to an input signal terminal of a next stage of GOA unit circuit, a reset signal terminal of the previous stage of GOA unit circuit is connected to an output signal terminal of the next stage of GOA unit circuit, and an input signal provided by an input signal terminal of a first stage of GOA unit circuit and a reset signal provided by a reset signal terminal of a last stage of GOA unit circuit are provided by the system.

In an embodiment, a discharge signal terminal of a previous stage of GOA unit circuit is connected to a pull-up node of a next stage of GOA unit circuit.

BRIEF DESCRIPTION OF THE DRAWINGS

In order to describe the technical solutions in the embodiments of the present disclosure or in the related art more clearly, the accompanying drawings required for describing the embodiments or the prior art will be described briefly below. Obviously, the accompanying drawings in the following description are merely some embodiments of the present disclosure. Other accompanying drawings can further be obtained by those of ordinary skill in the art according to these accompanying drawings without any creative work.

DETAILED DESCRIPTION

In order to make the purposes, features and advantages of the present disclosure more obvious and understandable, the technical solutions according to the embodiments of the present disclosure will be described clearly and completely below with reference to the accompanying drawings in the embodiments of the present disclosure. It is obvious that the described embodiments are merely a part of the embodiments of the present disclosure instead of all the embodiments. All other embodiments obtained by those of ordinary skill in the art based on the embodiments of the present disclosure without contributing any creative work are also within the protection scope of the present disclosure.

Figure 1:
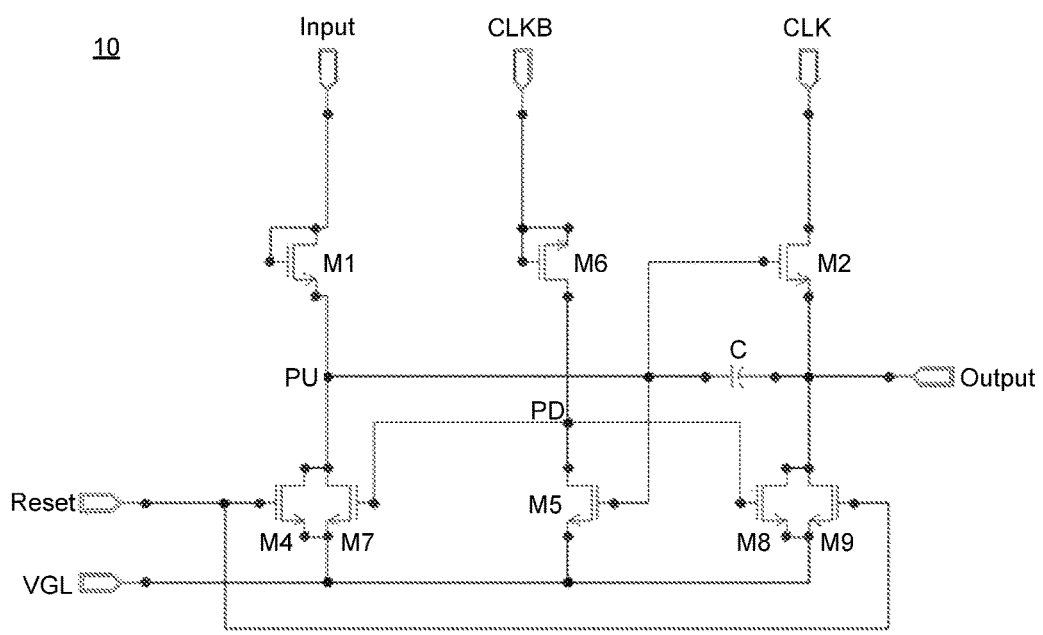
FIG. 1 is a structural diagram of a GOA unit circuit in the related art.
Figure 2:
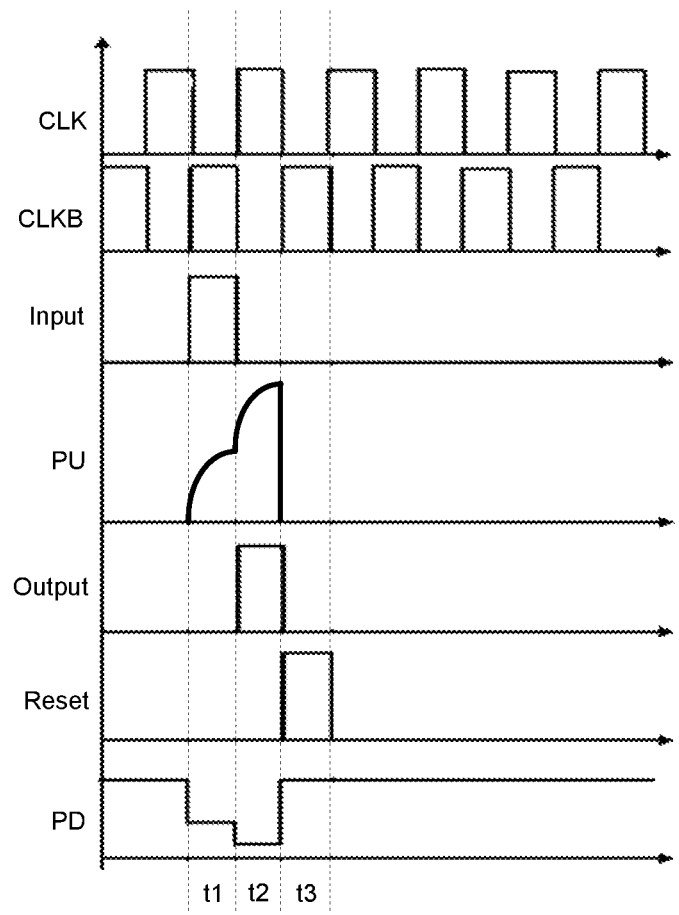
FIG. 2 is an operation timing diagram of a GOA unit circuit in the related art.

FIG. 1 is a structural diagram of a GOA unit circuit 10 in the related art. An operation timing of the GOA unit circuit 10 is shown in FIG. 2. A scanning period of one gate line comprises an input phase t1, an output phase t2 and a reset phase t3. In the input phase t1, a voltage at a pull-up node PU is pulled up, a voltage at a pull-down node PD is pulled down and an output signal Output is at a low level. In the output phase t2, the voltage at the pull-up node PU continues to be pulled up, the voltage at the pull-down node PD continues to be pulled down and the output signal Output is at a high level, to realize scanning of a corresponding gate line. In the reset phase, the voltage at the pull-up node PU is pulled down, the voltage at the pull-down node PD is pulled up, and operating states of various transistors in the GOA unit circuit 10 are reset.

Figure 3:
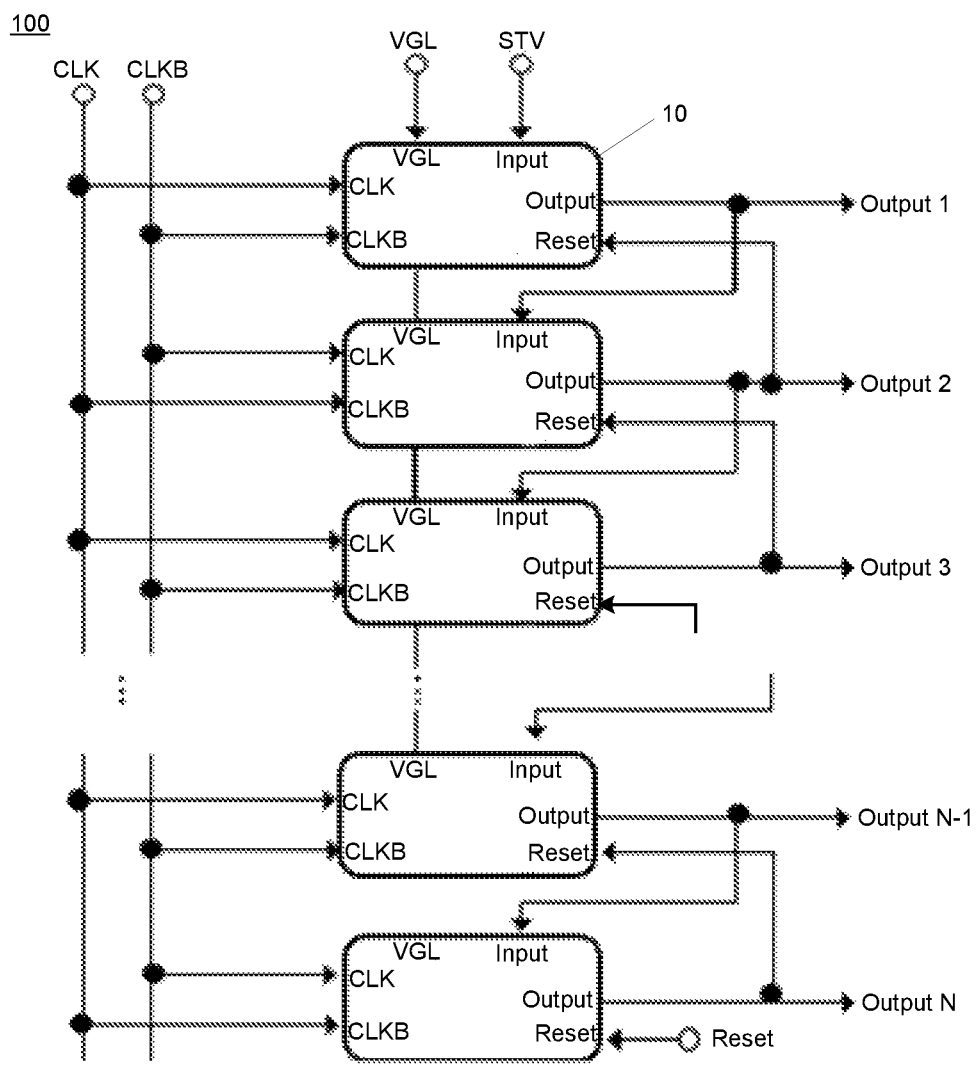
FIG. 3 is a diagram of a cascade of various GOA unit circuits in a GOA circuit in the related art.

In a GOA circuit, various GOA unit circuits are cascaded in a certain manner, to realize a shift register function. FIG. 3 is a diagram of a cascade of various GOA unit circuits 10 in a GOA circuit 100 in the related art. As can be seen from FIG. 3, except for a first stage of GOA unit circuit and a last stage of GOA unit circuit, in the GOA circuit 100, an output signal Output of a previous stage of GOA unit circuit is an input signal Input of a next stage of GOA unit circuit, a reset signal Reset of the previous stage of GOA unit circuit is an output signal Output of the next stage of GOA unit circuit, and a system provides an initial signal STV as an input signal Input of the first stage of GOA unit circuit, and provides a reset signal Reset as a reset signal Reset of the last stage of GOA unit circuit, so that Output 1-Output N are output sequentially, to realize a shift register function to scan various gate lines row by row.

During actual application of the GOA circuit 100, the inventor discovered that the GOA circuit 100 has large power consumption and a large occupied area, which results in a wide bezel of a display apparatus. One of reasons for these disadvantages is as follows.

As a capacitive load on a gate line is very large relative to internal capacitance of the GOA unit circuit 10, in order to ensure normal driving and charging of the gate line, a second transistor M2 in the GOA unit circuit 10 is required to be large enough. In general, a size of the second transistor M2 is several times to several tens of times sizes of other transistors in the GOA unit circuit 10. However, in the GOA unit circuit 10, a clock control signal CLK is a signal having the highest frequency among various GOA control signals (including the input signal Input, the reset signal Reset, a low level power supply signal VGL etc.), and thus a large portion of the power consumption of the GOA unit circuit 10 is caused by a capacitive load on the clock control signal CLK, that is, parasitic capacitance of the second transistor M2, and if the size of the second transistor M2 is too large, it undoubtedly causes the power consumption of the GOA circuit 100 to increase significantly.

Further, in the reset phase t3, the output signal Output is required to be rapidly reset to a low level VGL, and this process is generally required to be completed in a few microseconds; otherwise, data voltages of a next row of pixels may be mistakenly charged to pixels in a current row. The higher the pixel resolution, the shorter the time required for this process. In order to ensure that the output signal Output can be rapidly reset to the low level VGL, a size of a ninth transistor M9 is also required to be large enough, and is generally close to the size of the second transistor M2, thereby resulting in an increase of parasitic capacitance on the ninth transistor M9, which in turn causes an increase in the power consumption.

In the meantime, the larger the sizes of the second transistor M2 and the ninth transistor M9, the larger the occupied area of the GOA circuit 100, which results in a wide bezel of the display apparatus.

Figure 4:
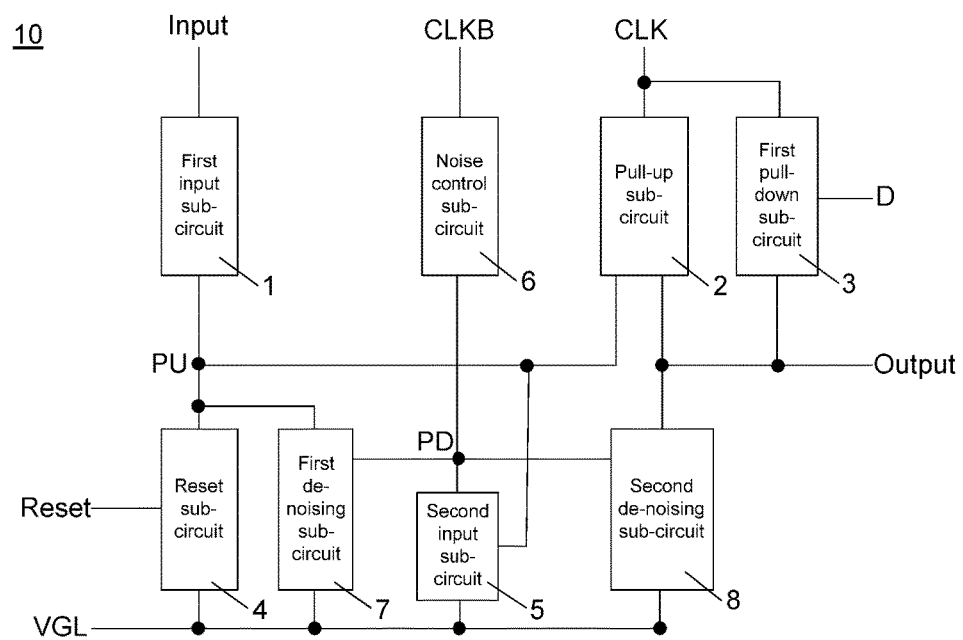
FIG. 4 is a first basic structural diagram of a GOA unit circuit according to an embodiment of the present disclosure.

Based on the above research results, in the present embodiment, the inventor of the present disclosure proposes a GOA unit circuit 10, as shown in FIG. 4, which comprises a first input sub-circuit 1, a pull-up sub-circuit 2, a pull-down sub-circuit 3, a reset sub-circuit 4, a second input sub-circuit 5, a noise control sub-circuit 6, a first de-noising sub-circuit 7 and a second de-noising sub-circuit 8. The first input sub-circuit 1 is connected to a pull-up node (referred to as a PU node hereinafter) and an input signal terminal (referred to as an Input terminal hereinafter). The pull-up sub-circuit 2 is connected to the PU node, a first clock control signal terminal (referred to as a CLK terminal hereinafter) and an output signal terminal (referred to as an Output terminal hereinafter). The first pull-down sub-circuit 3 is connected to the Output terminal, the CLK terminal and a discharge signal terminal (referred to as a D terminal hereinafter). The reset sub-circuit 4 is connected to the PU node, a reset signal terminal (referred to as a Reset terminal hereinafter) and a low level power supply signal terminal (referred to as a VGL terminal hereinafter). The second input sub-circuit 5 is connected to a pull-down node (referred to as a PD node hereinafter), the PU node and the VGL terminal. The noise control sub-circuit 6 is connected to the PD node and a second clock control signal terminal (referred to as a CLKB terminal hereinafter). The first de-noising sub-circuit 7 is connected to the PU node, the PD node and the VGL terminal. The second de-noising sub-circuit 8 is connected to the Output terminal, the PD terminal and the VGL terminal.

The first input sub-circuit 1 is configured to pull up a potential at the pull-up node PU for a first time under the control of an input signal Input provided by the Input terminal. The pull-up sub-circuit 2 is configured to pull up the potential at the PU node for a second time and transfer a high level of a first clock control signal CLK provided by the CLK terminal to the Output terminal for output under the control of the first clock control signal CLK. The first pull-down sub-circuit 3 is configured to discharge the Output terminal under the control of the first clock control signal CLK and a discharge signal D provided by the D terminal to pull down a potential at the Output terminal to a low level. The discharge signal D is at a high level higher than that of the input signal Input. The reset sub-circuit 4 is configured to reset the potential at the PU node under the control of a reset signal Reset provided by the Reset terminal and a low level power supply signal VGL provided by the VGL terminal. The second input sub-circuit 5 is configured to pull down a potential at the PD node for a first time under the control of the high potential at the PU node and the low level power supply signal VGL. The noise control sub-circuit 6 is configured to pull down the potential at the PD node for a second time under the control of a second clock control signal CLKB provided by the CLKB terminal. The first de-noising sub-circuit 7 is configured to de-noise the PU node under the control of the high potential at the PD node and the low level power supply signal VGL. The second de-noising sub-circuit 8 is configured to de-noise the Output terminal under the control of the high potential at the PD node and the low level power supply signal VGL.

In the GOA unit circuit 10 described above, after the Output terminal outputs the output signal Output at a high level, the potential at the Output terminal is required to be rapidly pulled down. In the present embodiment, the potential at the Output terminal is rapidly pulled down by adding a first pull-down sub-circuit 3 in the GOA unit circuit 10. This pull-down process is as follows. As the first clock control signal CLK is at a low level in this phase, the discharge signal D is at a high level capable of controlling the first pull-down sub-circuit 3 to be turned on. The discharge signal D at a high level is used to control the first pull-down sub-circuit 3 to be turned on, so that the low level of the first clock control signal CLK is transferred to the Output terminal via the first pull-down sub-circuit 3 to pull down the potential at the Output terminal. However, in the related art, the potential at the Output terminal is pulled down by the second transistor M2 (corresponding to the pull-up sub-circuit 2 in the present embodiment), and the potential at the PU node which controls the second transistor M2 to be turned on can only reach the high level of the input signal Input. As in the present embodiment, the discharge signal D is at a high level higher than that of the input signal Input, the discharge efficiency of the first pull-down sub-circuit 3 is higher than that of the second transistor M2 in the related art and is also higher than that of the pull-up sub-circuit 2 in the present embodiment. Thus, the potential at the Output terminal is pulled down mainly depending on the first pull-down sub-circuit 3, so that a size of a transistor in the pull-up sub-circuit 2 can be reduced. Further, the high discharge efficiency of the first pull-down sub-circuit 3 depends on the discharge signal D at a higher level which controls the first pull-down sub-circuit 3 to be turned on, and therefore a size of a transistor in the first pull-down sub-circuit 3 is not required to be too large. In this way, a sum of the size of the transistor in the pull-up sub-circuit 2 and the size of the transistor in the first pull-down sub-circuit 3 in the present embodiment is less than a size of a transistor in an individual pull-up sub-circuit in the related art. As the sizes of the transistors are reduced, both the power consumption and the occupied area of the transistors are reduced, so that the power consumption and the occupied area of the entire GOA unit circuit 10 are reduced, which is beneficial to realize low power consumption and a narrow bezel of the display apparatus. In addition, in the field of large-screen splicing technology, the narrowing of the bezel of the display apparatus is beneficial to reduce sizes of seams of a splicing screen and improve the display quality of the splicing screen. Therefore, the solution according to the present embodiment is more suitable for the field of large-screen splicing technology than the related art.

Based on the above solution of the GOA unit circuit 10, a specific structure of the GOA unit circuit 10 according to the present embodiment will be described below.

Figure 5:
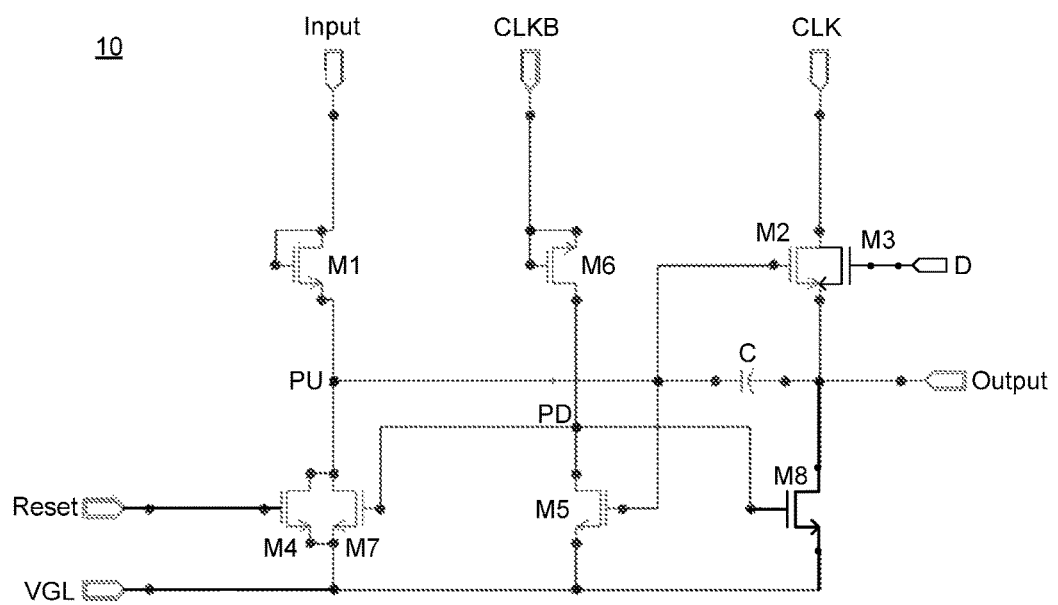
FIG. 5 is a specific structural diagram of the GOA unit circuit illustrated in FIG. 4.

As shown in FIG. 5, in the present embodiment, the first input sub-circuit 1 of the GOA unit circuit 10 may comprise a first transistor M1, having a control terminal and an input terminal both connected to the Input terminal, and an output terminal connected to the PU node. When the input signal Input provided by the Input terminal is at a high level, the first transistor M1 is turned on, and the high level of the input signal Input is transferred to the PU node, to realize pull-up of the potential at the PU node for a first time.

In the present embodiment, the pull-up sub-circuit 2 of the GOA unit circuit 10 may comprise a second transistor M2 and a capacitor C. The second transistor M2 has a control terminal connected to the PU node, an input terminal connected to the CLK terminal, and an output terminal connected to the Output terminal. The capacitor C has a first terminal connected to the PU node, and a second terminal connected to the Output terminal. When the potential at the PU node is pulled up for a first time, the second transistor M2 is turned on. At this time, the first clock control signal CLK provided by the CLK terminal is at a high level, and a potential at the second terminal of the capacitor C becomes a high level, that is, the potential at the Output terminal becomes a high level. Further, as the potential at the second terminal of the capacitor C becomes a high level, a potential at the first terminal of the capacitor C is coupled to a higher potential, to realize pull-up of the potential at the PU node for a second time.

In the present embodiment, the first pull-down sub-circuit 3 of the GOA unit circuit 10 may comprise a third transistor M3, having a control terminal connected to the D terminal, an input terminal connected to the CLK terminal, and an output terminal connected to the Output terminal. After the Output terminal outputs a high level, the potential at the Output terminal is required to be pulled down rapidly. At this time, the discharge signal D provided by the D terminal is at a high level, the third transistor M3 is turned on, and the first clock control signal CLK is at a low level, so that the potential at the Output terminal is pulled down. The discharge signal D is at a high level higher than that of the input signal Input, that is, a voltage at the control terminal of the third transistor M3 is higher than that of the control terminal of the second transistor M2. Further, a voltage at the input terminal of the third transistor M3 is the same as that at the input terminal of the second transistor M2. For a transistor, the higher the voltage difference between the control terminal and the input terminal, the higher the discharge efficiency. Therefore, the discharge efficiency of the third transistor M3 is higher than that of the second transistor M2, thereby achieving the effect of rapidly pulling down the potential at the Output terminal.

In the present embodiment, the reset sub-circuit 4 of the GOA unit circuit 10 may comprise a fourth transistor M4, having a control terminal connected to the Reset terminal, an input terminal connected to the VGL terminal, and an output terminal connected to the PU node. After the potential at the Output terminal is rapidly pulled down, the potential at the PU node is required to be reset. At this time, the reset signal Reset provided by the Reset terminal is at a high level, the fourth transistor M4 is turned on, and the low level power supply signal VGL provided by the VGL terminal is transferred to the PU node via the fourth transistor M4, so that the potential at the PU node is pulled down to complete the reset.

In the present embodiment, the second input sub-circuit 5 of the GOA unit circuit 10 may comprise a fifth transistor M5 having a control terminal connected to the PU node, an input terminal connected to the VGL terminal, and an output terminal connected to the PD node. In the present embodiment, the noise control sub-circuit 6 of the GOA unit circuit 10 may comprise a sixth transistor M6 having a control terminal and an input terminal both connected to the CLKB terminal, and an output terminal connected to the PD node. When the potential at the PU node is pulled up for a first time, the fifth transistor M5 is turned on, and the low level power supply signal VGL is transferred to the PD node via the fifth transistor M5. At this time, the second clock control signal CLKB provided by the CLKB terminal is at a high level, the sixth transistor M6 is turned on, and the high level of the second clock control signal CLKB is transferred to the PD node via the sixth transistor M6, to realize pull-down of the potential at the PD node for a first time. When the potential at the PU node is pulled up for a second time, the fifth transistor M5 is still turned on, and the low level power supply signal VGL is transferred to the PD node via the fifth transistor M5. At this time, the second clock control signal CLKB provided by the CLKB terminal is at a low level, and the sixth transistor M6 is turned off, to realize pull-down of the potential at the PD node for a second time.

In the present embodiment, the first de-noising sub-circuit 7 of the GOA unit circuit 10 may comprise a seventh transistor M7, having a control terminal connected to the PD node, an input terminal connected to the VGL terminal, and an output terminal connected to the PU node. After the high level of the potential at the PU node ends, the PU node is required to be de-noised so as to prevent noises from being accumulated at the PU node, prevent the potential at the PU node from being increased, and prevent the pull-up sub-circuit 2 from being turned on mistakenly. When de-noising is performed, the potential at the PU node is at a low level, the second input sub-circuit 5 is turned off, the second clock control signal CLKB is at a high level, the noise control sub-circuit 6 is turned on, the potential at the PD node is pulled up, the seventh transistor M7 is turned on, the low level power supply signal VGL is input to the PU node via the seventh transistor M7, and the potential at the PU node is at a low level, so as to realize de-noising of the PU node.

In the present embodiment, the second de-noising sub-circuit 8 of the GOA unit circuit 10 may comprise an eighth transistor M8 having a control terminal connected to the PD node, an input terminal connected to the VGL terminal, and an output terminal connected to the Output terminal. After output of the high level of the Output terminal ends, and the potential at the Output terminal is rapidly pulled down to a low level, the Output terminal is required to be de-noised, to prevent noises from being accumulated at the Output terminal and prevent the potential at the Output terminal from being increased, which may otherwise cause a corresponding gate line to be turned on thereby resulting in mistaken charging of corresponding pixels. When de-noising is performed, the potential at the PU node is at a low level, the second input sub-circuit 5 is turned off, the second clock control signal CLKB is at a high level, the noise control sub-circuit 6 is turned on, the potential at the PD node is pulled up, the eighth transistor M8 is turned on, the low level power supply signal VGL is input to the Output terminal via the eighth transistor M8, and the potential at the Output terminal is at a low level, so as to realize de-noising of the Output terminal.

If various sub-circuits in the GOA unit circuit 10 according to the present embodiment adopt the specific structures of various sub-circuits described above, that is, the structure of the GOA unit circuit 10 is the structure as shown in FIG. 5, the GOA unit circuit 10 can not only reduce both the power consumption and the occupied area, but also does not increase a number of transistors included in the GOA unit circuit 10 relative to the related art, which is also beneficial to reduce the power consumption and the occupied area.

Figure 6:
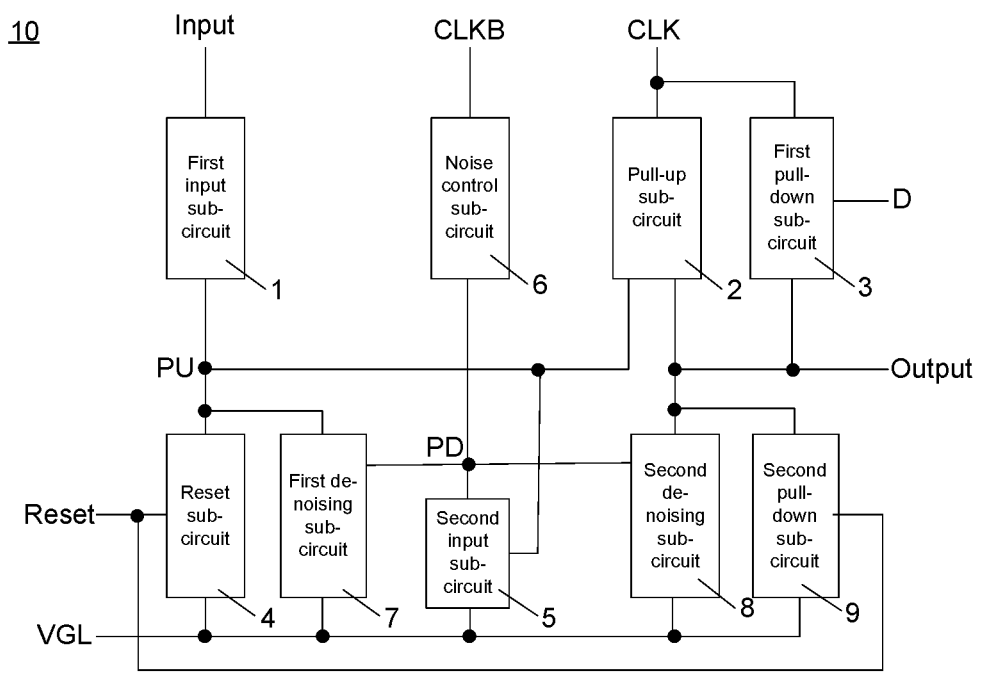
FIG. 6 is a second basic structural diagram of a GOA unit circuit according to an embodiment of the present disclosure.

As shown in FIG. 6, in the GOA unit circuit 10 according to the present embodiment, in order to pull down the potential at the Output terminal more rapidly, a second pull-down sub-circuit 9 may be provided to be connected to the Output terminal, the Reset terminal and the VGL terminal. The second pull-down sub-circuit 9 is configured to transfer the low level power supply signal VGL to the Output terminal for output under the control of the reset signal Reset and the low level power supply signal VGL, so as to speed up the pull-down of the potential at the Output terminal.

Figure 7:
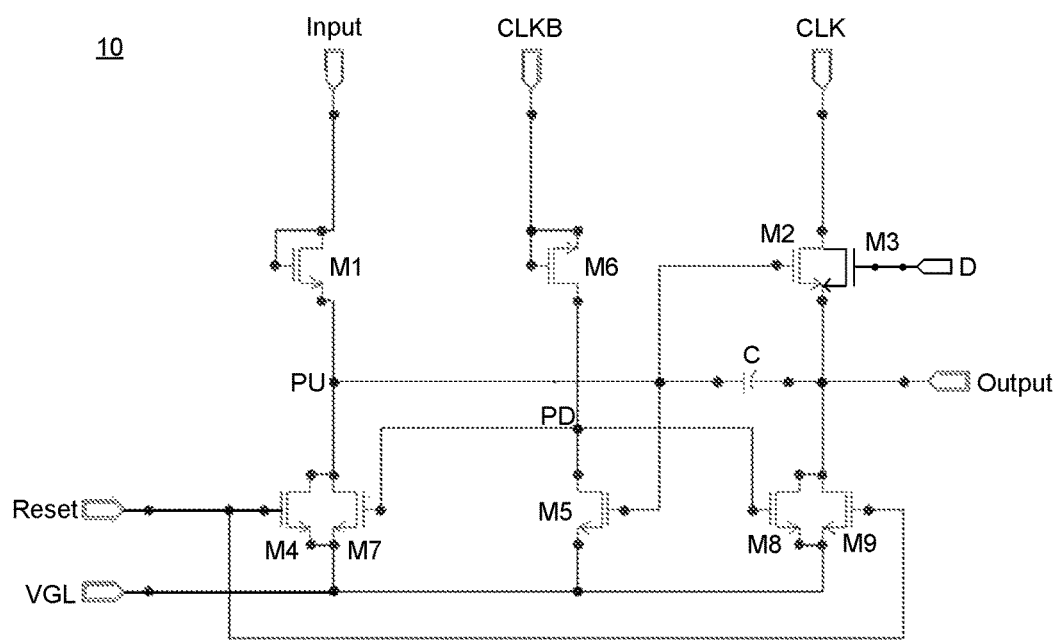
FIG. 7 is a specific structural diagram of the GOA unit circuit illustrated in FIG. 6.

As shown in FIG. 7, with respect to the solution of the second pull-down sub-circuit 9 described above, the second pull-down sub-circuit 9 may specifically comprise a ninth transistor M9 having a control terminal connected to the Reset terminal, an input terminal connected to the VGL terminal, and an output terminal connected to the Output terminal. When the potential at the Output terminal is required to be pulled down rapidly, the reset signal Reset is at a high level, the ninth transistor M9 is turned on, and the low level power supply signal VGL is transferred to the Output terminal via the ninth transistor M9 to speed up the pull-down of the potential at the Output terminal.

In the GOA unit circuit according to the present disclosure, a first pull-down sub-circuit is added, wherein the first pull-down sub-circuit is connected to the output signal terminal, the first clock control signal terminal and the discharge signal terminal, and can discharge the output signal terminal and pull down the potential at the output signal terminal to a low level under the control of the first clock control signal provided by the first clock control signal terminal and the discharge signal provided by the discharge signal terminal. As the discharge signal provided by the discharge signal terminal is at a high level higher than that of the input signal provided by the input signal terminal, the discharge efficiency of the first pull-down sub-circuit is higher than that of the pull-up sub-circuit and thus the potential at the output signal terminal is pulled down mainly depending on the first pull-down sub-circuit, so that a size of a transistor in the pull-up sub-circuit can be reduced. Further, the high discharge efficiency of the first pull-down sub-circuit depends on the discharge signal at a higher level, and therefore a size of a transistor in the first pull-down sub-circuit is not required to be too large. Therefore, a sum of the size of the transistor in the pull-up sub-circuit and the size of the transistor in the first pull-down sub-circuit is less than a size of a transistor in an individual pull-up sub-circuit in the related art. As the sizes of the transistors are reduced, both the power consumption and the occupied area of the transistors are reduced, so that the power consumption and the occupied area of the entire GOA unit circuit are reduced.

Figure 8:
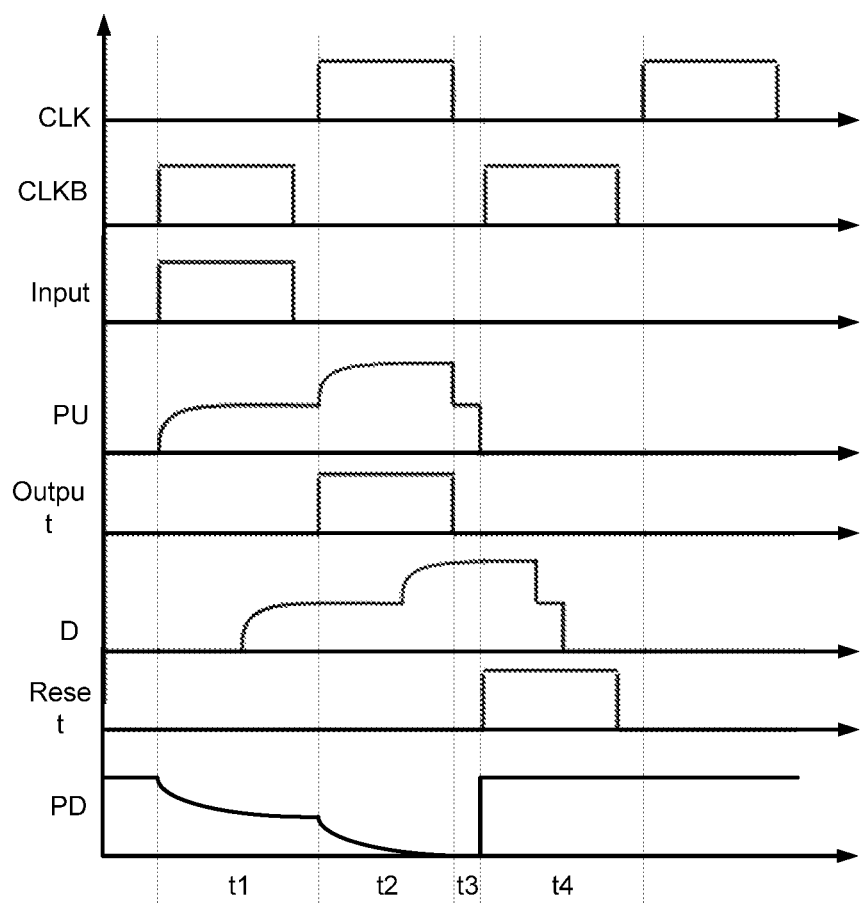
FIG. 8 is a control timing diagram of a GOA unit circuit according to an embodiment of the present disclosure.

The present embodiment provides a method for driving a GOA unit circuit. As shown in FIGS. 4 and 8, the driving method is used to drive the GOA unit circuit 10 according to the first embodiment. One frame of time sequentially comprises an input period t1, an output period t2, a discharge period t3, and a reset period t4.

In the input period t1, the input signal Input is at a high level, the first input sub-circuit 1 is turned on, the potential at the PU node is pulled up, the pull-up sub-circuit 2 is turned on, the first clock control signal CLK is at a low level, and the Output terminal outputs a low level. At the same time, the reset signal Reset is at a low level, and the reset sub-circuit 4 is turned off. The second clock control signal CLKB is at a high level, the noise control sub-circuit 6 is turned on, and under the control of the high potential at the PU node, the second input sub-circuit 5 is turned on, the low level power supply signal VGL is input to the PD node via the second input sub-circuit 5 to pull down the potential at the PD node, and the first de-noising sub-circuit 7 and the second de-noising sub-circuit 8 are turned off.

In the output period t2, the pull-up sub-circuit 2 is maintained to be turned on, the first clock control signal CLK becomes a high level, the potential at the PU node continues to be pulled up, and the Output terminal outputs a high level. At the same time, the input signal Input becomes a low level, the first input sub-circuit 1 is turned off, the reset signal Reset is still at a low level, and the reset sub-circuit 4 is turned off. The second clock control signal CLKB is at a low level, the noise control sub-circuit 6 is turned off, the second input sub-circuit 5 is maintained to be turned on, the low level power supply signal VGL continues to be input to the PD node via the second input sub-circuit 5 to continue to pull down the potential at the PD node, and the first de-noising sub-circuit 7 and the second de-noising sub-circuit 8 are turned off.

In the discharge period t3, the discharge signal D is at a high level higher than that of the input signal Input, the first pull-down sub-circuit 3 is turned on, the first clock control signal CLK becomes a low level, and the potential at the Output terminal is pulled down to a low level. At the same time, the input signal Input is still at a low level, the first input sub-circuit 1 is turned off, the potential at the PU node is decreased to a certain extent, the pull-up sub-circuit 2 is maintained to be turned on, the reset signal Reset is still at a low level and the reset sub-circuit 4 is turned off. The second clock control signal CLKB is still at a low level, the noise control sub-circuit 6 is turned off, the second input sub-circuit 5 is maintained to be turned on, the low level power supply signal VGL continues to be input to the PD node via the second input sub-circuit 5 to continue to maintain the potential at the PD node at a low level, and the first de-noising sub-circuit 7 and the second de-noising sub-circuit 8 are turned off.

In the reset period t4, the reset signal Reset becomes a high level, the reset sub-circuit 4 is turned on, the low level power supply signal VGL is input to the PU node via the reset sub-circuit 4 to pull down the potential at the PU node to a low level, the pull-up sub-circuit 2 is turned off, and the Output terminal still outputs a low level. At the same time, the input signal Input is still at a low level and the first input sub-circuit 1 is turned off. The second clock control signal CLKB becomes a high level, the noise control sub-circuit 6 is turned on, and under the control of the low potential at the PU node, the second input sub-circuit 5 is turned off, the potential at the PD node becomes a high level, and the first de-noising sub-circuit 7 and the second de-noising sub-circuit 8 are turned on, so that the first de-noising sub-circuit 7 de-noises the PU node, and the second de-noising sub-circuit 8 de-noises the Output terminal.

In the method for driving the GOA unit circuit 10, in the discharge period t3, the first pull-down sub-circuit 3 is used to pull down the potential at the Output terminal rapidly. As the high level of the discharge signal D for controlling the first pull-down sub-circuit 3 to be turned on is higher than that of the input signal Input, the discharge efficiency of the first pull-down sub-circuit 3 is higher than that of the second transistor M2 in the related art and is also higher than that of the pull-up sub-circuit 2 in the present embodiment. Thereby, the size of the transistor in the pull-up sub-circuit 2 is reduced, and the size of the transistor in the first pull-down sub-circuit 3 is not required to be too large, so that a sum of the size of the transistor in the pull-up sub-circuit 2 and the size of the transistor in the first pull-down sub-circuit 3 is less than a size of an individual pull-up sub-circuit in the related art, thereby reducing the power consumption and the occupied area of the GOA unit circuit 10.

The driving method according to the present embodiment will be described below with reference to a specific circuit structure. As shown in FIGS. 5 and 8, the driving method according to the present embodiment comprises the following steps.

In an input period t1, the input signal Input is at a high level, the first transistor M1 is turned on, the potential at the PU node is pulled up, the second transistor M2 is turned on, the first clock control signal CLK is at a low level, and the Output terminal outputs a low level. The reset signal Reset is at a low level, and the fourth transistor M4 is turned off. The second clock control signal CLKB is at a high level, the sixth transistor M6 is turned on, and under the control of the high potential at the PU node, the fifth transistor M5 is turned on, the low level power supply signal VGL is input to the PD node via the fifth transistor M5 to pull down the potential at the PD node, and the seventh transistor M7 and the eighth transistor M8 are turned off.

In an output period t2, the second transistor M2 is maintained to be turned on, the first clock control signal CLK becomes a high level, the potential at the PU node continues to be pulled up, and the Output terminal outputs a high level. The input signal Input becomes a low level, the first transistor M1 is turned off, the reset signal Reset is still at a low level, and the fourth transistor M4 is turned off. The second clock control signal CLKB is at a low level, the sixth transistor M6 is turned off, the fifth transistor M5 is maintained to be turned on, the low level power supply signal VGL continues to be input to the PD node via the fifth transistor M5 to continue to pull down the potential at the PD node, and the seventh transistor M7 and the eighth transistor M8 are turned off.

In the discharge period t3, the discharge signal D is at a high level higher than that of the input signal Input, the third transistor M3 is turned on, the first clock control signal CLK becomes a low level, and the potential at the Output terminal is pulled down to a low level. The input signal Input is still at a low level, the first transistor M1 is turned off, the potential at the PU node is decreased to a certain extent, the second transistor M2 is maintained to be turned on, the reset signal Reset is still at a low level, and the fourth transistor M4 is turned off. The second clock control signal CLKB is still at a low level, the sixth transistor M6 is turned off, the fifth transistor M5 is maintained to be turned on, the low level power supply signal VGL continues to be input to the PD node via the fifth transistor M5 to continue to maintain the potential at the PD node at a low level, and the seventh transistor M7 and the eighth transistor M8 are turned off.

In the reset period t4, the reset signal Reset becomes a high level, the fourth transistor M4 is turned on, the low level power supply signal VGL is input to the PU node via the fourth transistor M4 to pull down the potential at the PU node to a low level, the second transistor M2 is turned off, and the Output terminal still outputs a low level. The input signal Input is still at a low level, and the first transistor M1 is turned off. The second clock control signal CLKB becomes a high level, the sixth transistor M6 is turned on, and under the control of the low potential at the PU node, the fifth transistor M5 is turned off, the potential at the PD node becomes a high level, and the seventh transistor M7 and the eighth transistor M8 are turned on, so that the seventh transistor M7 de-noises the PU node, and the eighth transistor M8 de-noises the Output terminal.

In a method for driving a GOA unit circuit 10 having the specific structure described above, in the discharge period t3, the voltage at the control terminal of the third transistor M3 is the discharge signal D and the voltage at the control terminal of the second transistor M2 is the voltage at the PU node. At this time, the voltage at the PU node does not exceed the input signal Input. The discharge signal D is at a high level higher than that of the input signal Input at this time. For a transistor, the higher the voltage at the control terminal, the faster the discharge rate of the control terminal. Therefore, the discharge efficiency of the third transistor M3 is greater than that of the second transistor M2, and the potential at the Output terminal can be rapidly pulled down by the third transistor M3, so that the size of the second transistor M2 can be reduced, and as the voltage at the control terminal of the third transistor M3 is at a higher level, the size of the third transistor M3 is not required to be too large to ensure a rapid discharge efficiency. After simulation, in a case of the same falling time of the potential at the Output terminal, a sum of the size of the second transistor M2 and the size of the third transistor M3 using the solutions according to the present embodiment can be reduced by more than 20% relative to a size of an individual second transistor M2 in the related art. Thereby, the power consumption and the occupied area of the GOA unit circuit 10 are reduced significantly, which is beneficial to realize low power consumption and a narrow bezel of the display apparatus.

As shown in FIG. 6, when the GOA unit circuit 10 to which the driving method according to the present embodiment is applied further comprises the second pull-down sub-circuit 9, the driving method further comprises the following step. In the reset period t4, the reset signal Reset is at a high level, and the second pull-down sub-circuit 9 is turned on to transfer the low level power supply signal VGL to the Output terminal for output. In the input period t1, the output period t2 and the discharge period t3, the reset signal Reset is at a low level, and the second pull-down sub-circuit 9 is turned off. In the reset period t4, the second pull-down sub-circuit 9 is turned on, which can further speed up the pull-down of the potential at the Output terminal to a low level. As shown in FIG. 7, with respect to the solution that the second pull-down sub-circuit 9 comprises a ninth transistor M9, a corresponding driving process is specifically as follows. In the reset period t4, the reset signal Reset is at a high level, and the ninth transistor M9 is turned on to transfer the low level power supply signal VGL to the Output terminal for output. In the input period t1, the output period t2 and the discharge period t3, the reset signal Reset is at a low level, and the ninth transistor M9 is turned off.

Figure 9:
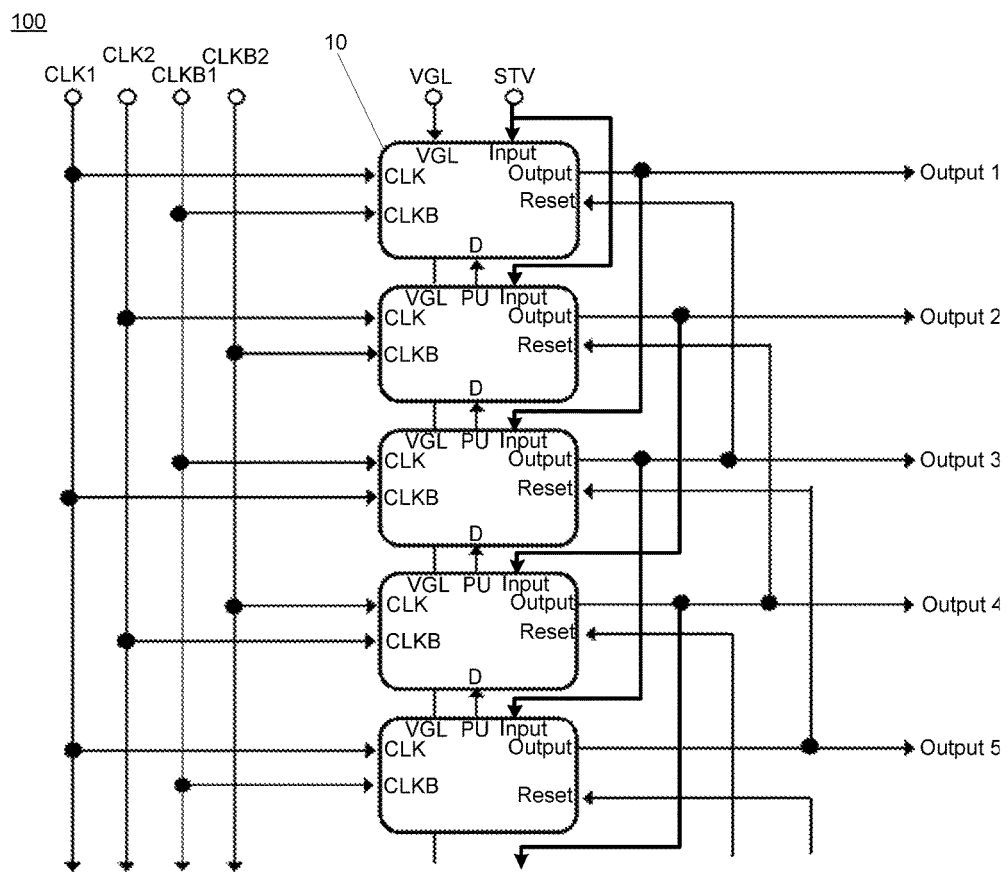
FIG. 9 is a diagram of a cascade of various GOA unit circuits in a GOA circuit according to an embodiment of the present disclosure.

As shown in FIG. 9, the present embodiment provides a GOA circuit 100, which comprises a plurality of cascaded GOA unit circuits 10. A D terminal of a previous stage of GOA unit circuit 10 is connected to a PU node of a certain next stage of GOA unit circuit.

CLK terminals and CLKB terminals of odd stages of GOA unit circuits are connected to a first group of clock signal input lines (CLK1 and CLKB1). In each of various odd stages of GOA unit circuits, an Output terminal of a previous stage of GOA unit circuit is connected to an Input terminal of a next stage of GOA unit circuit, a Reset terminal of the previous stage of GOA unit circuit is connected to an Output terminal of the next stage of GOA unit circuit, and an input signal Input provided by an Input terminal of a first stage of GOA unit circuit and a reset signal Reset provided by a Reset terminal of a last stage of GOA unit circuit are provided by a system.

CLK terminals and CLKB terminals of even stages of GOA unit circuits are connected to a second group of clock signal input lines (CLK2 and CLKB2). In each of various even stages of GOA unit circuits, an Output terminal of a previous stage of GOA unit circuit is connected to an Input terminal of a next stage of GOA unit circuit, a Reset terminal of the previous stage of GOA unit circuit is connected to an Output terminal of the next stage of GOA unit circuit, and an input signal Input provided by an Input terminal of a first stage of GOA unit circuit and a reset signal Reset provided by a Reset terminal of a last stage of GOA unit circuit are provided by the system.

It should be illustrated that the "system" described in the present embodiment refers to a power supply system in the display apparatus.

As described above, as the GOA unit circuit has advantages such as low power consumption and a small occupied area, the GOA circuit 100 formed by cascading such GOA unit circuits also has the advantage such as low power consumption and a small occupied area.

It should be illustrated that in the GOA circuit 100 described above, two groups of clock control signals are used to control the odd stages of GOA unit circuits and the even stages of GOA unit circuits, respectively, so that PU waveforms of two adjacent stages of GOA unit circuits overlap. Thereby, a PU node of a certain stage of GOA unit circuit after a previous stage of GOA unit circuit may be used to provide a discharge signal D at a high level to a D terminal of the previous stage of GOA unit circuit. In this way, the PU node of the certain stage of GOA unit circuit after the previous stage of GOA unit circuit is efficiently used to provide the discharge signal D at a high level to the D terminal of the previous stage of GOA unit circuit without the system additionally providing a discharge signal at a high level to a D terminal of each stage of GOA unit circuit, which not only saves the power consumption, but also simplifies the structure of the GOA circuit 100.

Based on the above technical solution, preferably, referring to FIG. 9 again, a D terminal of a previous stage of GOA unit circuit may be connected to a PU node of a next stage of GOA unit circuit. In combination with FIG. 8, a PU waveform may be regarded as a PU waveform of the previous stage of GOA unit circuit, and a D waveform may be regarded as a PU waveform of the next stage of GOA unit circuit. It can be seen that the PU waveform of the next stage of GOA unit circuit ends later than the PU waveform of the previous stage of GOA unit circuit by a half of a period of a CLK high level. Therefore, when the previous stage of GOA unit circuit is in the discharge period t3, the potential at the PU node of the next stage of GOA unit circuit is just pulled up to the highest level, which is about two times the VGH (i.e., the voltage of the high level power supply signal), so that the potential at the D terminal of the previous stage of GOA unit circuit is about two times the VGH. By taking the structure of the GOA unit circuit being the structure shown in FIG. 5 as an example, it is illustrated that the potential at the control terminal of the third transistor M3 in the previous stage of GOA unit circuit is about two times the VGH, and at this time, the potential at the PU node in the previous stage of GOA unit circuit has been decreased to be about one time the VGH, i.e., the high level of the input signal Input. That is, the potential at the control terminal of the second transistor M2 in the previous stage of GOA unit circuit is merely one time the VGH. Thus, the potential at the control terminal of the third transistor M3 is much higher than that at the control terminal of the second transistor M2. Thereby, the discharge rate of the third transistor M3 is much higher than that of the second transistor M2, so that a sum of a size of the second transistor M2 and a size of the third transistor M3 is reduced relative to a size of an individual second transistor M2 in the related art, which means that the power consumption and the occupied area of the entire GOA circuit 100 are reduced, which is beneficial to realize low power consumption and a narrow bezel of the display apparatus.

The foregoing description is merely specific embodiments of the present disclosure, but the protection scope of the present disclosure is not limited thereto. Changes or substitutions which can be easily reached by any skilled in the art within the technical scope disclosed in the present disclosure should be included in the protection scope of the present disclosure. Therefore, the protection scope of the present disclosure should be defined by the protection scope of the claims.

We claim:

1. A Gate Driver on Array (GOA) unit circuit, comprising:
    a first input sub-circuit connected to a pull-up node and an input signal terminal, and configured to pull up a potential at the pull-up node during a first time under control of an input signal provided by the input signal terminal;
    a pull-up sub-circuit connected to the pull-up node, a first clock control signal terminal and an output signal terminal, and configured to pull up the potential at the pull-up node during a second time and transfer a high level of a first clock control signal provided by the first clock control signal terminal to the output signal terminal for output under control of the first clock control signal;
    a first pull-down sub-circuit connected to the output signal terminal, the first clock control signal terminal and a discharge signal terminal, configured to discharge the output signal terminal under control of the first clock control signal provided by the first clock control signal terminal and a discharge signal provided by the discharge signal terminal to pull down a potential at the output signal terminal to a low level;
    a reset sub-circuit connected to the pull-up node, a reset signal terminal and low level power supply signal terminal, and configured to reset the potential at the pull-up node under control of a reset signal provided by the reset signal terminal and a low level power supply signal provided by the low level power supply signal terminal;
    a second input sub-circuit connected to a pull-down node, the pull-up node and the low level power supply signal terminal, and configured to pull down a potential at the pull-down node during the first time under control of a high potential at the pull-up node and the low level power supply signal provided by the low level power supply signal terminal;
    a noise control sub-circuit connected to the pull-down node and a second clock control signal terminal, and configured to pull down the potential at the pull-down node during the second time under control of a second clock control signal provided by the second clock control signal terminal;
    a first de-noising sub-circuit connected to the pull-up node, the pull-down node and the low level power supply signal terminal, and configured to de-noise the pull-up node under control of a high potential at the pull-down node and the low level power supply signal provided by the low level power supply signal terminal; and
    a second de-noising sub-circuit connected to the output signal terminal, the pull-down node and the low level power supply signal terminal, and configured to de-noise the output signal terminal under control of the high potential at the pull-down node and the low level power supply signal provided by the low level power supply signal terminal,
    wherein in a discharge period, the discharge signal is at a high level higher than that of the input signal, and the pull-up sub-circuit and the first pull-down sub-circuit are configured to pull down the potential at the output signal terminal to the low level collectively under control of the discharge signal and the first clock control signal.

2. The GOA unit circuit according to claim 1, wherein the first input sub-circuit comprises a first transistor having a control terminal and an input terminal both connected to the input signal terminal, and an output terminal connected to the pull-up node.

3. The GOA unit circuit according to claim 1, wherein the pull-up sub-circuit comprises:
    a second transistor having a control terminal connected to the pull-up node, an input terminal connected to the first clock control signal terminal, and an output terminal connected to the output signal terminal; and
    a capacitor having a first terminal connected to the pull-up node, and a second terminal connected to the output signal terminal.

4. The GOA unit circuit according to claim 1, wherein the first pull-down sub-circuit comprises a third transistor having a control terminal connected to the discharge signal terminal, an input terminal connected to the first clock control signal terminal, and an output terminal connected to the output signal terminal.

5. The GOA unit circuit according to claim 1, wherein the reset sub-circuit comprises a fourth transistor having a control terminal connected to the reset signal terminal, an input terminal connected to the low level power supply signal terminal, and an output terminal connected to the pull-up node.

6. The GOA unit circuit according to claim 1, wherein the second input sub-circuit comprises a fifth transistor having a control terminal connected to the pull-up node, an input terminal connected to the low level power supply signal terminal, and an output terminal connected to the pull-down node.

7. The GOA unit circuit according to claim 1, wherein the noise control sub-circuit comprises a sixth transistor having a control terminal and an input terminal both connected to the second clock control signal terminal, and an output terminal connected to the pull-down node.

8. The GOA unit circuit according to claim 1, wherein the first de-noising sub-circuit comprises a seventh transistor having a control terminal connected to the pull-down node, an input terminal connected to the low level power supply signal terminal, and an output terminal connected to the pull-up node.

9. The GOA unit circuit according to claim 1, wherein the second de-noising sub-circuit comprises an eighth transistor having a control terminal connected to the pull-down node, an input terminal connected to the low level power supply signal terminal, and an output terminal connected to the output signal terminal.

10. The GOA unit circuit according to claim 1, further comprising a second pull-down sub-circuit connected to the output signal terminal, the reset signal terminal and the low level power supply signal terminal, and configured to transfer the low level power supply signal to the output signal terminal for output under control of the reset signal provided by the reset signal terminal and the low level power supply signal provided by the low level power supply signal terminal.

11. The GOA unit circuit according to claim 10, wherein the second pull-down sub-circuit comprises a ninth transistor having a control terminal connected to the reset signal terminal, an input terminal connected to the low level power supply signal terminal, and an output terminal connected to the output signal terminal.

12. A method for driving a Gate Driver on Array (GOA) unit circuit, applied to the GOA unit circuit according to claim 1, the method comprising:
in an input period, setting the input signal to a high level, so that the first input sub-circuit is turned on, the potential at the pull-up node is pulled up, and the pull-up sub-circuit is turned on; setting the first clock control signal to a low level, so that the output signal terminal outputs a low level; setting the reset signal to a low level, so that the reset sub-circuit is turned off; and setting the second clock control signal to a high level, so that the noise control sub-circuit is turned on, and under control of the high potential at the pull-up node, the second input sub-circuit is turned on, the low level power supply signal is input to the pull-down node via the second input sub-circuit to pull down the potential at the pull-down node, and the first de-noising sub-circuit and the second de-noising sub-circuit are turned off;
in an output period, maintaining the pull-up sub-circuit to be turned on, and setting the first clock control signal to a high level, so that the potential at the pull-up node continues to be pulled up and the output signal terminal outputs a high level; setting the input signal to a low level, so that the first input sub-circuit is turned off, and still setting the reset signal to a low level, so that the reset sub-circuit is turned off; and setting the second clock control signal to a low level, so that the noise control sub-circuit is turned off, the second input sub-circuit is maintained to be turned on, the low level power supply signal continues to be input to the pull-down node via the second input sub-circuit to continue to pull down the potential at the pull-down node, and the first de-noising sub-circuit and the second de-noising sub-circuit are turned off;
in the discharge period, setting the discharge signal to a high level higher than that of the input signal, so that the first pull-down sub-circuit is turned on; setting the first clock control signal to a low level, so that the potential at the output signal terminal is pulled down to a low level; still setting the input signal to a low level, so that the first input sub-circuit is turned off, the potential at the pull-up node is decreased to some extent, and the pull-up sub-circuit is maintained to be turned on, and still setting the reset signal to a low level, so that the reset sub-circuit is turned off; and still setting the second clock control signal to a low level, so that the noise control sub-circuit is turned off, the second input sub-circuit is maintained to be turned on, the low level power supply signal continues to be input to the pull-down node via the second input sub-circuit to continue to maintain the potential at the pull-down node at a low level, and the first de-noising sub-circuit and the second de-noising sub-circuit are turned off; and
in a reset period, setting the reset signal to a high level, so that the reset sub-circuit is turned on, the low level power supply signal is input to the pull-up node via the reset sub-circuit to pull down the potential at the pull-up node to a low level, the pull-up sub-circuit is turned off, and the output signal terminal still outputs a low level; still setting the input signal to a low level, so that the first input sub-circuit is turned off; and setting the second clock control signal to a high level, so that the noise control sub-circuit is turned on, and under control of a low potential at the pull-up node, the second input sub-circuit is turned off, and the potential at the pull-down node becomes a high level, and the first de-noising sub-circuit and the second de-noising sub-circuit are turned on, so that the first de-noising sub-circuit de-noises the pull-up node, and the second de-noising sub-circuit de-noises the output signal terminal.

13. The method for driving a GOA unit circuit according to claim 12, wherein the GOA unit circuit further comprises a second pull-down sub-circuit connected to the output signal terminal, the reset signal terminal and the low level power supply signal terminal, and configured to transfer the low level power supply signal to the output signal terminal for output under control of the reset signal provided by the reset signal terminal and the low level power supply signal provide by the low level power supply signal terminal, the method further comprising:
in the reset period, setting the reset signal to a high level, so that the second pull-down sub-circuit is turned on to transfer the low level power supply signal to the output signal terminal for output; and
in the input period, the output period and the discharge period, setting the reset signal to a low level, so that the second pull-down sub-circuit is turned off.

14. A Gat Driver on Array (GOA) circuit, comprising a plurality of cascaded GOA unit circuits according to claim 1, wherein
a discharge signal terminal of a previous stage of GOA unit circuit is connected to a pull-up node of any stage subsequent to the previous stage of GOA unit circuit;
first clock control signal terminals and second clock control signal terminals of odd stages of GOA unit circuits are connected to a first group of clock signal input lines; and in each of various odd stages of GOA unit circuits, an output signal terminal of a previous odd stage of GOA unit circuit is connected to an input signal terminal of a next odd stage of GOA unit circuit, a reset signal terminal of the previous odd stage of GOA unit circuit is connected to an output signal terminal of the next odd stage of GOA unit circuit, and an input signal provided by an input signal terminal of a first odd stage of GOA unit circuit and a reset signal provided by a reset signal terminal of a last odd stage of GOA unit circuit are provided by a system; and first clock control signal terminals and second clock control signal terminals of even stages of GOA unit circuit are connected to a second group of clock signal input lines; and in each of various even stages of GOA unit circuits, an output signal terminal of a previous even stage of GOA unit circuit is connected to an input signal terminal of a next even stage of GOA unit circuit, a reset signal terminal of the previous even stage of GOA unit circuit is connected to an output signal terminal of the next even stage of GOA unit circuit, and an input signal provided by an input signal terminal of a first even stage of GOA unit circuit and a reset signal provided by a reset signal terminal of a last even stage of GOA unit circuit are provided by the system.

* * * * *